(12) United States Patent
Seipp (10) Patent No.: US 7,375,809 B2
(45) Date of Patent: May 20, 2008

(54) ALIGNMENT ROUTINE FOR OPTICALLY BASED TOOLS

(75) Inventor: Steven J. Seipp, Stanfordville, NY (US)

(73) Assignee: International Business Machines Corporation, Armonk, NY (US)

( * ) Notice: Subject to any disclaimer, the term of this patent is extended or adjusted under 35 U.S.C. 154(b) by 435 days.

(21) Appl. No.: 10/604,010

(22) Filed: Jun. 20, 2003

(65) Prior Publication Data

US 2004/0257570 A1     Dec. 23, 2004

(51) Int. Cl.
*G01B 11/00* (2006.01)
*G06K 9/00* (2006.01)
*G03B 27/32* (2006.01)
*G03C 5/00* (2006.01)

(52) U.S. Cl. .................. 356/401; 382/151; 355/77; 430/30

(58) Field of Classification Search ............... None
See application file for complete search history.

(56) References Cited

U.S. PATENT DOCUMENTS

| | | | | |
|---|---|---|---|---|
| 4,327,292 A | * | 4/1982 | Wang et al. | 250/491.1 |
| 4,475,122 A | * | 10/1984 | Green | 348/87 |
| 4,515,480 A | * | 5/1985 | Miller et al. | 356/400 |
| 4,769,523 A | * | 9/1988 | Tanimoto et al. | 219/121.6 |
| 4,870,288 A | * | 9/1989 | Abuku et al. | 250/548 |
| 5,621,813 A | * | 4/1997 | Brown et al. | 382/151 |
| 5,696,835 A | * | 12/1997 | Hennessey et al. | 382/141 |
| 6,225,011 B1 | * | 5/2001 | Gotoh et al. | 430/22 |
| 6,278,957 B1 | * | 8/2001 | Yasuda et al. | 702/150 |
| 6,347,291 B1 | * | 2/2002 | Berman | 702/150 |
| 6,528,219 B1 | | 3/2003 | Conrad et al. | |
| 6,801,825 B2 | * | 10/2004 | Utsunomiya | 700/121 |

FOREIGN PATENT DOCUMENTS

EP     1124163 A2     8/2001

* cited by examiner

*Primary Examiner*—Gregory J. Toatley, Jr.
*Assistant Examiner*—Gordon J Stock, Jr.
(74) *Attorney, Agent, or Firm*—Cantor Colburn LLP; Lisa U. Jaklitsch (57) ABSTRACT

A method is provided for using a point of interest as a starting point where an alignment is automatically selected by recognition software for a patterned substrate. The method includes disposing the patterned substrate on a stage of an exposure system, the exposure system having an alignment routine including; locating a first point of interest on the patterned substrate; scanning a first area proximate the first point of interest for a first unique feature; defining a periodicity for the patterned substrate; locating a second point of interest based on the periodicity; scanning a second area proximate the second point of interest for a second unique feature corresponding to the first unique feature; gathering alignment data from at least scanning the first and second areas; and determining substrate position relative to the exposure system from alignment data of at least the first and second scanned areas.

8 Claims, 7 Drawing Sheets

ALIGNMENT ROUTINE FOR OPTICALLY BASED TOOLS

BACKGROUND OF INVENTION

This disclosure relates to optical alignment systems and more particularly, to a system and method for improving an alignment routine for lithography or pattern recognition.

Integrated circuit chips are fabricated one level at a time. The levels include diffusions, gates, metal lines, insulation, isolation, and contacts. The structures on these levels must be precisely positioned so that the finished chip has structures properly positioned. The step of positioning a level with respect to a previously formed level is called alignment.

Current industry methodologies require alignments of some feature to allow for orientation of a part. More specifically, alignment of patterned materials involves manual selection of alignment targets. The alignment targets typically include two or three alignment marks which a recognition system uses to learn a position of the part or material subject to examination. The user then provides a region of interest (ROI) by manually moving to this location while the software records this coordinate. Alternatively, a coordinate relative to some known reference point (e.g., center of the part) is indicated by the software.

Furthermore, if multiple patterns exist on the part as found in semiconductor wafers, then a step periodicity is supplied to find the next ROI. Once the setup is completed (i.e., after the alignment marks are recorded) the optical system aligns and moves to a ROI on the part for measurement or inspection.

One drawback to the above approach is that time is needed to teach the alignment mark locations relative to a ROI and is wasted time. Furthermore, pattern recognition systems which fail to align are unable to re-teach themselves since no point of origin has been established.

SUMMARY OF INVENTION

In an exemplary embodiment, a method is provided for using a point of interest as a starting point where an alignment is automatically selected by recognition software for a patterned substrate. The method includes disposing the patterned substrate on a stage of an exposure system having an alignment routine. The alignment routine includes locating a first point of interest on the patterned substrate and scanning a first area proximate the first point of interest for a first unique feature. A periodicity for the patterned substrate is defined and a second point of interest is located based on the periodicity. A second area proximate the second point of interest is scanned for a second unique feature corresponding to the first unique feature. Alignment data is gathered from at least scanning the first and second areas. The substrate position relative to the exposure system is determined from alignment data of at least the first and second scanned areas.

In an alternative embodiment, a method is provided for aligning a patterned substrate having a plurality of segments and measuring the same. The method includes defining a point of interest for each segment of the patterned substrate and locating a first point of interest in a first segment. A first area proximate the first point of interest is scanned for a first unique feature and saving a scanned image of the first area. A periodicity is defined for the patterned substrate for locating a second point of interest in a second segment based on the periodicity. A second area proximate the second point of interest is scanned for a second unique feature corresponding to the first unique feature. The alignment of the substrate with respect to tooling in which it is disposed is mapped. The second point of interest is measured before locating a third point of interest in a third segment based on the periodicity.

BRIEF DESCRIPTION OF DRAWINGS

FIG. 1b is a more detailed view of the alignment system of FIG. 1a;

DETAILED DESCRIPTION

Photolithography tools have alignment systems for aligning a level to be printed with a level already on the wafer. The alignment system first determines the location of an alignment target on the wafer that was printed during a previous photolithographic process step. Once the location of the alignment target is established, the system adjusts the location of the wafer so the present level is printed at the proper location with respect to that previous level target. The previous level target can be the first level printed, the last level so far printed, or any level in between.

Alignment systems on photolithography tools are generally designed to work with specific types of alignment marks on the wafer. The alignment system acquires an alignment signal by optically scanning an alignment mark. The alignment signal is then analyzed to determine the location of the alignment mark on the wafer. This is repeated for several alignment marks in different exposure fields on the wafer. From three to eight marks are typically used. The data from this group of alignment marks is then processed with a computer in the photolithography tool to determine the location of the wafer.

Commonly a photolithography tool has an alignment system capable of reading several alignment marks. Furthermore, a number of alignment signal analysis algorithms can be applied to the alignment signal. The term "alignment component" will be used in this application to describe alignment system hardware, alignment marks on a substrate, and alignment signal analysis software.

The present invention provides a more robust alignment routine that saves time and provides a path to auto correct the alignment routine should it fail during operation.

Figure 1A:
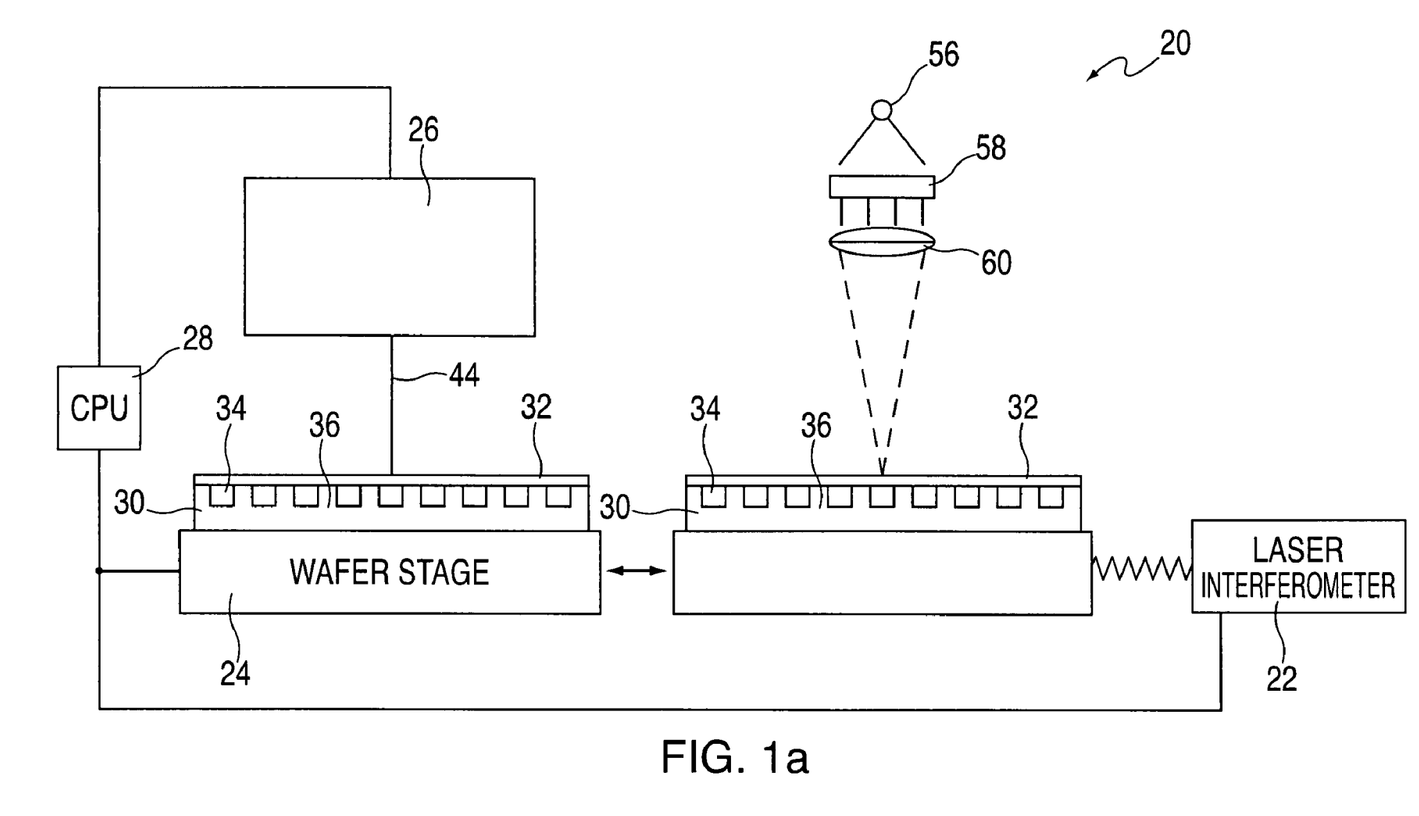
FIG. 1a is a side view of a photolithography system having an alignment system.

The invention applies to optically based tools for inspection and/or measurement, such as for example, step-and-repeat or step-and-scan photolithography tools such as tool 20 shown in FIG. 1a. Photolithography tool 20 includes laser interferometer 22 which controls wafer stage 24. Tool 20 also includes an alignment system 26, and computer 28 to analyze alignment data. A substrate, such as silicon wafer 30, coated with a photsensitive layer 32 and containing alignment marks or unique features 34 on prior level 36 is located on wafer stage 24.

Figure 1B:
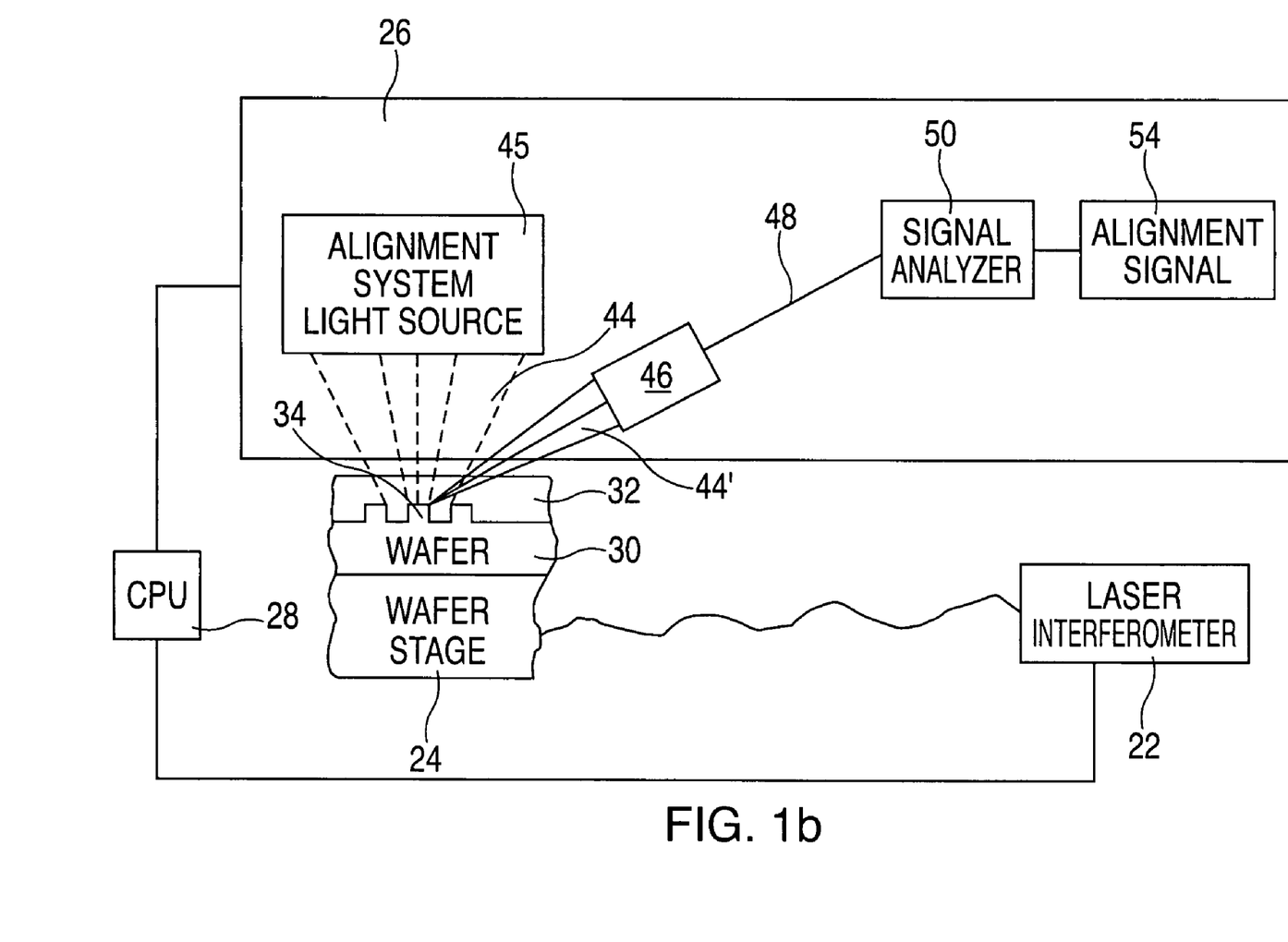

In operation, alignment system 26 sequentially shines incident light beam 44 from light source 45 on alignment mark 34 on wafer 30, as shown in more detail in the enlarged view of FIG. 1b.

In a typical alignment process as presently practiced in the industry, light beam 44 from alignment system 26 is focused on a portion of alignment mark 34 on wafer 30 and is diffracted by that portion over a wide range of angles. Some of that diffracted light 44' is gathered by detector 46 which converts it to an electrical signal which is transmitted along wire 48 to signal analyzer 50 which includes an analog to digital converter. Wafer stage 24 is moved so that incident light 44 scans across alignment target 34 so signals are eventually received from all portions of alignment mark 34. As alignment target 34 is scanned, light signal 44' striking detector 46 varies in intensity, and electrical signal output 48 from detector 46 correspondingly varies. Signal 48 is correlated with wafer stage position information from interferometer 22 to produce alignment signal 54, the output of signal analyzer 50. The location of alignment target 34 is then determined from characteristics of electrical signal 54 using computer 28. This signal is analyzed with standard analysis algorithms. However, parameters of these algorithms can be changed and evaluated using the method of the present invention. For example, alignment can be expedited and provide an automatic correction should the alignment routine fail during operation. Exposure system 20 also includes illuminator 56, reticle 58, and objective lens 60, as shown in FIG. 1a.

Figure 2:
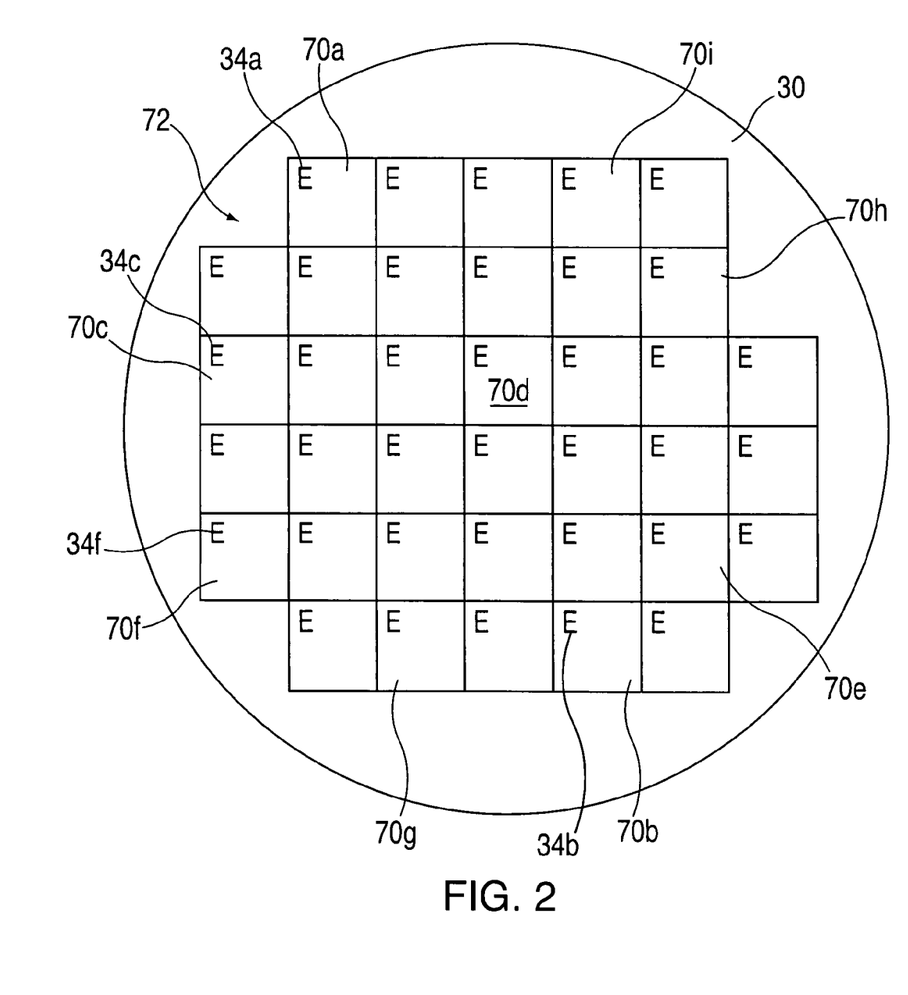
FIG. 2 is a top view of a wafer having multiple exposure fields and an alignment target or unique feature in each exposure field.

In standard practice, step-and-repeat or step-and-scan photolithography tools place exposure fields 70a, 70b . . . 70i on wafer 30 in an array pattern, as shown in the top view of FIG. 2. The first exposure field 70a at which alignment data is to be collected is manually positioned in the field of view of alignment system 26, and the location of alignment mark 34a in field 70a is determined as shown in block 101 of the flow chart of FIG. 3. The location of an alignment mark may be defined as the location of the center of the mark, and this x-y location is saved for later processing.

Next, second alignment field 70b is positioned in the field of view of alignment system 26, and the location of alignment target 34b of field 70b is determined, as provided in standard practice, well known in the industry. This procedure is continued for additional exposure fields 70c, 70d, 70e or to a number of fields chosen by the user. At least two or three fields are currently required for a recognition system to learn a position of wafer 30 being subjected to examination.

Figure 3:
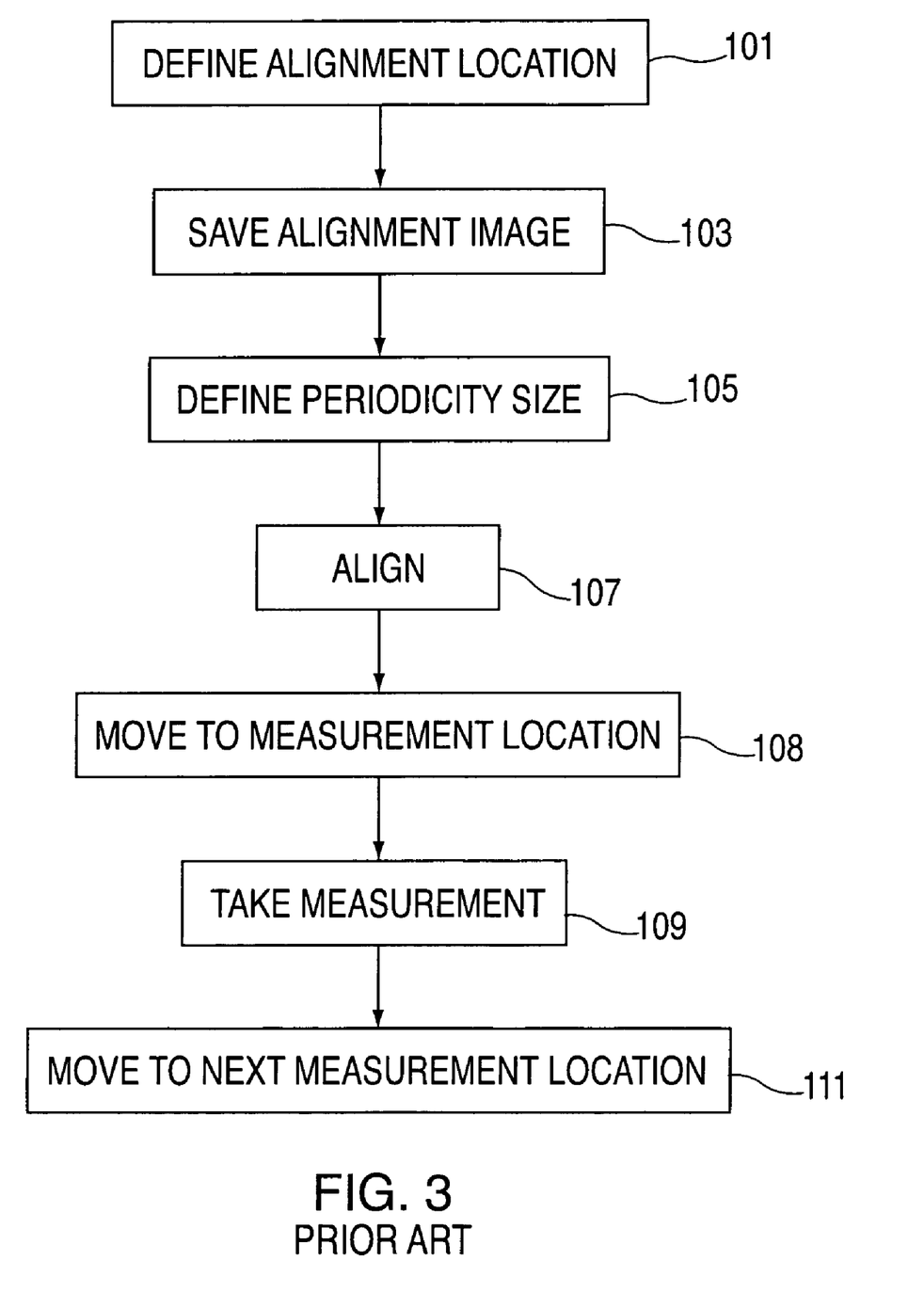
FIG. 3 is a flow chart showing prior art process steps for alignment with respect to alignment marks and a region of interest.

Once the alignment marks have been recorded an alignment image is saved at block 103, a periodicity is defined at block 105 to move between different points of interest for examination on wafer 30. At block 107, the system is aligned based on the saved alignment image and periodicity size and a user manually moves to a point of interest of an exposure field an offset distance at block 108 and takes measurements at block 109 before moving to the next measurement location at block 111.

However, it should be noted that the when the above system fails to align at block 107, it cannot re-teach itself since no point of reference has been established in blocks 101 and/or block 103.

Figure 4:
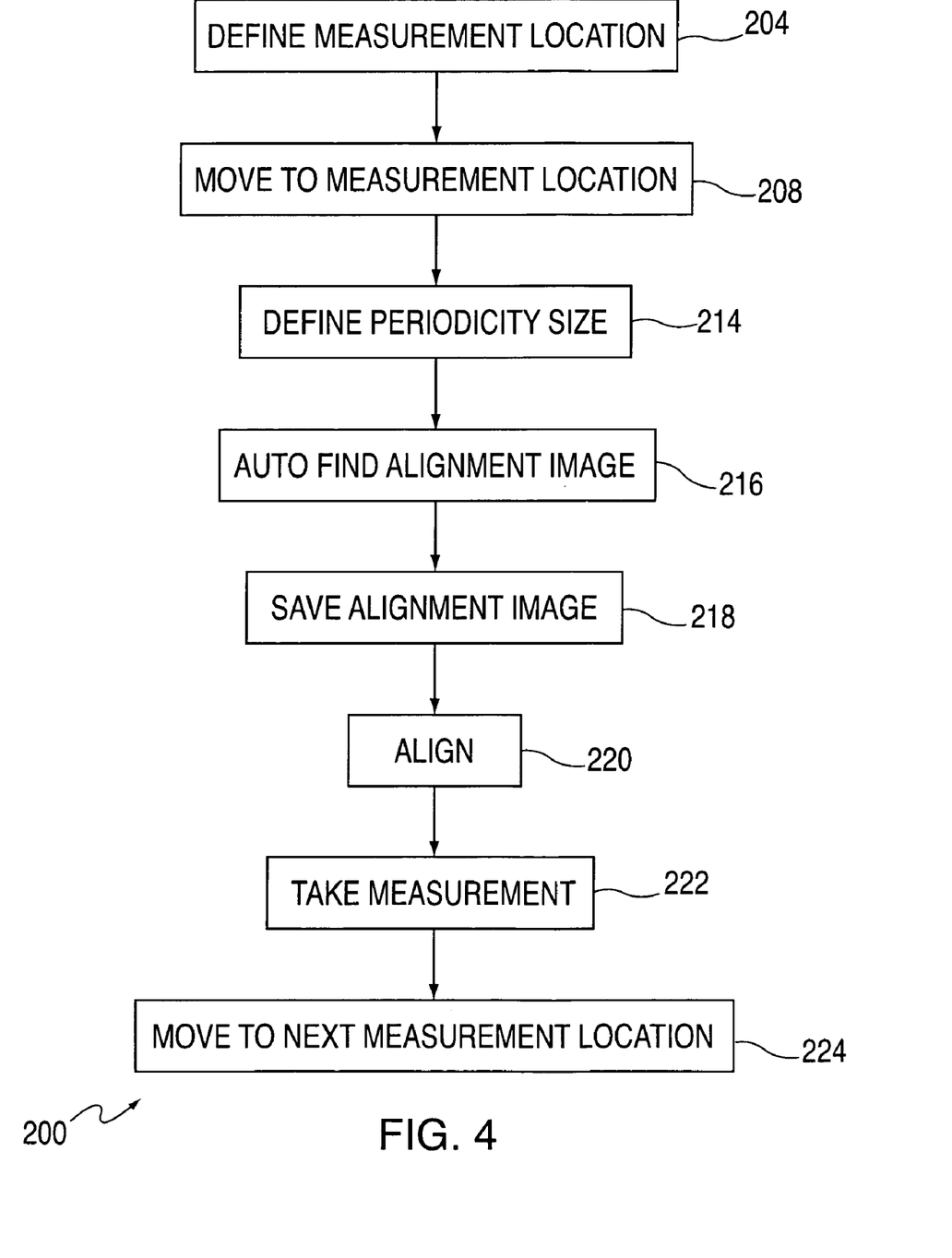
FIG. 4 is a flow chart showing process steps for an exemplary embodiment of the present invention.

Referring now to FIGS. 4-8, an exemplary method for an alignment subroutine will now be described. A flowchart in FIG. 4 illustrates one exemplary method generally at 200 while FIGS. 5-8 illustrate portions of wafer 30 being scanned at a point of interest or measurement location 202.

Figure 5:
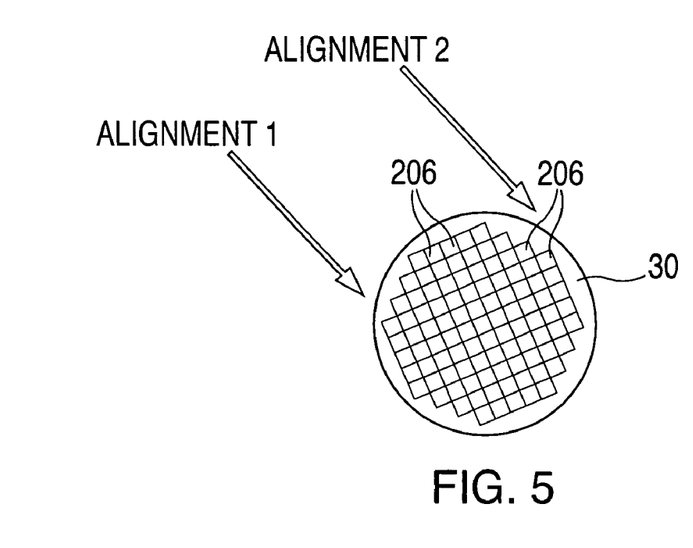
FIG. 5 illustrates a patterned semiconductor wafer subjected to two alignment scans.
Figure 6:
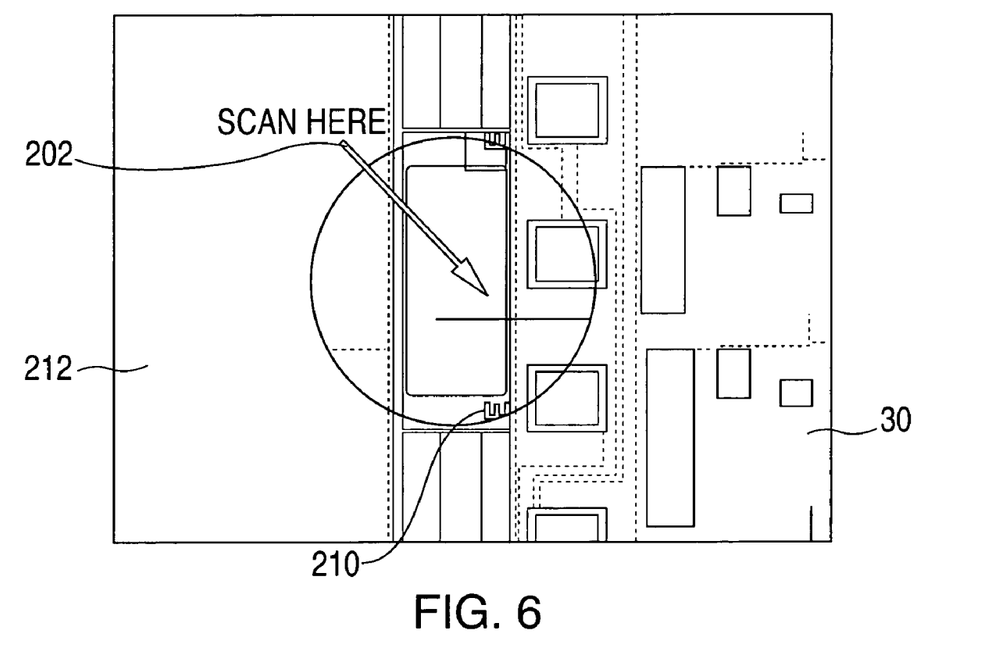
FIG. 6 illustrates a portion of the wafer of FIG. 1 being scanned at a first point of interest to locate a unique feature within the scanned area.
Figure 7:
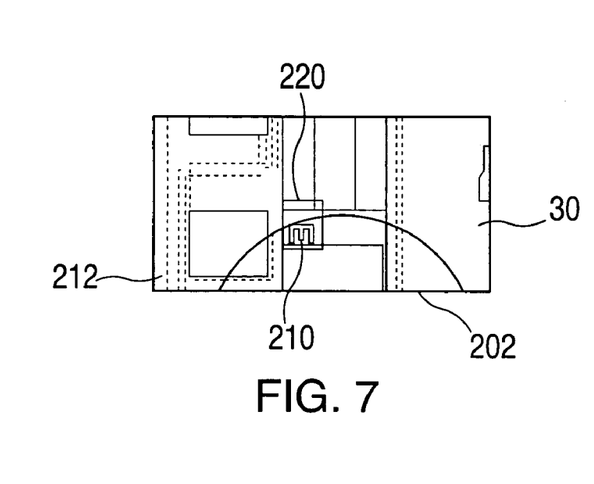
FIG. 7 illustrates a portion of the scanned area of FIG. 6 detailing a first unique feature therein.

First at block 204, measurement location or point of interest 202 is defined. As illustrated, point of interest 202 with respect to wafer 30 is within a single die 206 of wafer 30. Next, wafer stage 24 is moved at block 208 so that point of interest 202 may be scanned to locate a unique feature 210 within a scan area 212 proximate point of interest 202 (FIGS. 5 and 6). It should be noted that unique feature 210 may be an alignment mark, however, one aspect of the present invention provides for elimination of providing a designated alignment mark. Instead, a unique feature 210 proximate point of interest 202 is located.

Next, a periodicity is defined at block 214. It will be appreciated by one skilled in the art that scan area 212 may be as small or large as needed to locate a unique feature proximate point of interest 202. More specifically, software performs a raster movement around point of interest 202 until it detects a feature unique within the field of view or scan area 212 at block 216. As illustrated in FIGS. 3 and 6-8, the unique feature 210 depicted therein is the letter "E", however, the software is configured to detect other suitable unique features within each die 206. At block 218, the software saves an alignment image 220 depicted in FIG. 7.

At block 220, the alignment of wafer 30 with respect to wafer stage 24 is completed after the above described alignment routine automatically locates alignment images saved at block 218 at two or three sites to determine relative part position.

Figure 8:
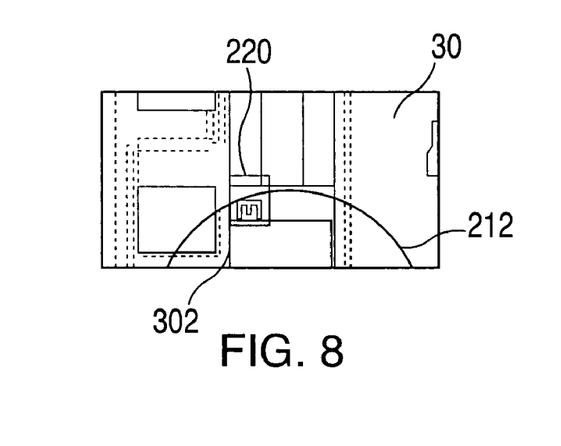
FIG. 8 illustrates a portion of a second scanned area having a second unique feature like the first unique feature of FIG. 7.

Next, a measurement or inspection of the point of interest 202 is completed at block 222 before moving to another point of interest 302 at block 224 based on the periodicity defined at block 214. FIG. 8 reflects this second point of interest 302 having the alignment image 220 saved at block 218.

As before, the software performs a raster movement around point of interest 302 until it detects a feature unique within the field of view or scan area 212 as in block 216. In particular, the unique feature 210, or letter "E" as illustrated, for example, corresponds to the saved alignment image 220. Next, a measurement or inspection of the point of interest 302 is completed before moving to another point of interest based on the periodicity defined at block 214.

The above described embodiments allow the use of the point of interest as a starting point and have the alignments selected automatically by recognition software. In this manner, setting up alignment routines is eliminated. It also provides a path to automatically correct the alignment routine should it fail during operation, since no point of origin or reference point needs to be established first. Further, separately providing designated alignment marks and initially locating the same is avoided.

In summary, the above described alignment routine allows the user to first move to or locate a first point of interest and supply or define a step periodicity. The software performs a raster movement around the first point of interest until it detects a feature unique within the field of view. Once a unique feature is found and saved, the system moves over the defined periodicity to locate the same unique feature in a second point of interest thereby completing the alignment routine. This alignment routine requires at least two sites to determine part position. In this manner, alignment marks are not necessary and alignment with respect to the same is eliminated.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method of aligning a substrate to an exposure system, the method comprising:
    disposing a patterned substrate on a stage of an exposure system, the exposure system having an alignment routine including;
    locating a first point of interest on the patterned substrate, the first point of interest being within a single die of a semiconductor wafer;
    scanning a first area on the patterned substrate proximate the first point of interest for a first unique feature within the single die;
    defining a periodicity for the patterned substrate, the periodicity corresponding to the scan area of a raster movement used in locating the first unique feature;
    locating a second point of interest on the patterned substrate;
    scanning a second area on the patterned substrate proximate the second point of interest, based on the defined periodicity used in locating the first unique feature, for a second unique feature corresponding to the first unique feature, wherein the first unique feature is saved as an alignment image for use in locating the second unique feature in the second area;
    gathering alignment data with respect to the patterned substrate from the scanning of the first area on the patterned substrate proximate the first point of interest for the first unique feature and the scanning of the second area on the patterned substrate proximate the second point of interest for the second unique feature corresponding to the first unique feature; and
    determining substrate position relative to the exposure system from the gathered alignment data.

2. The method as recited in claim 1, further comprising using the alignment data for aligning the substrate.

3. The method as recited in claim 1, further comprising exposing the substrate with the exposure system.

4. The method as recited in claim 1, wherein said first and second unique features include alignment marks on the substrate.

5. The method as recited in claim 1, wherein gathering alignment data includes mapping first and second points of interests and corresponding unique features to determine an orientation of the substrate.

6. The method as recited in claim 1, wherein the alignment routine is configured to provide a path for automatic correction should the alignment routine fail to align.

7. The method as recited in claim 1, wherein the substrate comprises a plurality of exposure fields, wherein the method comprises at least one of inspecting and measuring at least one point of interest in each field of a plurality of exposure fields.

8. The method as recited in claim 1, wherein the substrate comprises a plurality of exposure fields, wherein each exposure field comprises at least one unique feature.

* * * * *